United States Patent [19]

Leroux et al.

[11] 3,947,956

[45] Apr. 6, 1976

[54] MULTILAYER THICK-FILM HYBRID CIRCUITS METHOD AND PROCESS FOR CONSTRUCTING SAME

[75] Inventors: Adrien Leroux; Alexandre Kocsis, both of Sherbrooke, Canada; George D. Lane, Muncy, N.Y.

[73] Assignee: The University of Sherbrooke, Sherbrooke, Canada

[22] Filed: July 3, 1974

[21] Appl. No.: 485,568

[52] U.S. Cl. .................. 29/625; 156/89; 174/68.5; 264/61; 317/101 B
[51] Int. Cl.² ........................................ H05K 3/00
[58] Field of Search ............. 29/625, 628; 174/68.5; 317/101 B; 156/89; 264/58, 59, 61, 63; 101/129

[56] References Cited

UNITED STATES PATENTS

| | | | |
|---|---|---|---|
| 3,770,529 | 11/1973 | Anderson | 156/89 X |
| 3,772,748 | 11/1973 | Rutt | 174/68.5 UX |
| 3,798,762 | 3/1974 | Harris et al. | 264/61 X |
| 3,852,877 | 12/1974 | Ahn et al. | 156/89 X |

OTHER PUBLICATIONS

IBM Technical Disclosure Bull., "Capillary Forming Paste," Ahn, Miller, Wilcox, Vol. 8, No. 10, Mar. 1966, pp. 1307–1308.

*Primary Examiner*—C. W. Lanham
*Assistant Examiner*—James R. Duzan
*Attorney, Agent, or Firm*—Fetherstonhaugh & Co.

[57] ABSTRACT

A method and process of screening multilayer thick-film structures to produce complex hybrid electronic circuits. After deposition, drying and firing of the first conductor plane on the substrate, registration ink is deposited and allowed to dry thus forming temporary vias. A suitable dielectric paste is then deposited either on all the surface or except on viaslocations. The dielectric paste is then dried and fired. Firing however causes sublimation or evaporation of the temporary vias pattern leaving cavities in the dielectric layer. Slight buffing may be required to uncover the via holes. The vias and the second conductor plane are then deposited, dried and fired. The same steps are carried out for each subsequent conductor plane.

6 Claims, 6 Drawing Figures

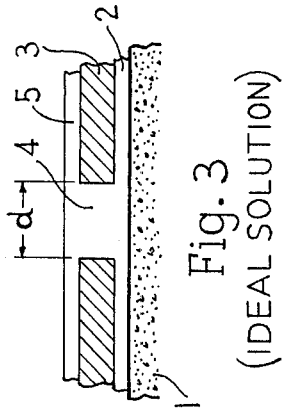
Fig.3 (IDEAL SOLUTION)
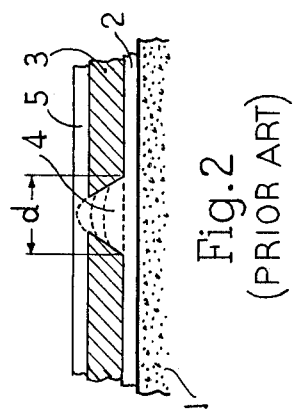
Fig.2 (PRIOR ART)
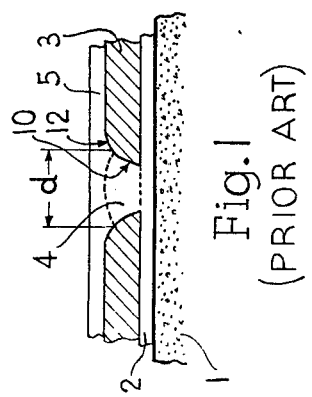
Fig.1 (PRIOR ART)
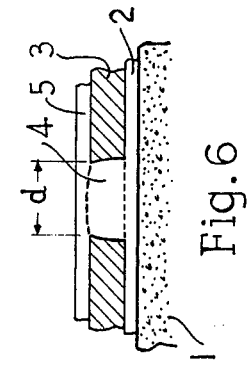
Fig.6
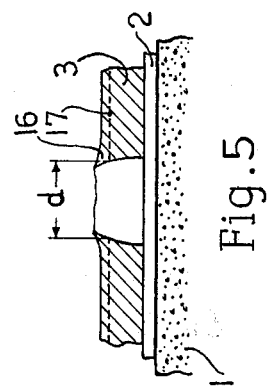
Fig.5
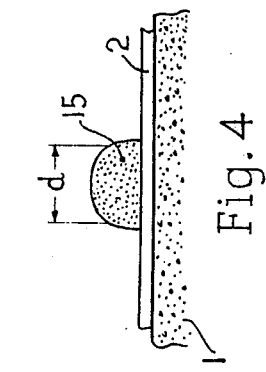
Fig.4

MULTILAYER THICK-FILM HYBRID CIRCUITS METHOD AND PROCESS FOR CONSTRUCTING SAME

This invention relates to multilayer thick-film hybrid circuits and in particular to process for constructing such hybrid circuits with improved interconnections of the conductors in the various layers.

A major difficulty encountered when constructing thick-film multilayer hybrid circuits resides in the making of interconnection vias of controlled maximum dimensions and with practically zero failure rate. Indeed, the failure of only one interconnection via normally renders the entire hybrid circuit useless. It is also well known that the via hole screenability controls the packing density of conductors and integrated circuits for each unit of area on the substrate. When use is made of a relatively viscous ceramic paste, the via hole screenability is improved but the capacity of the paste to seal pin holes is diminished with the result that a compromise must be reached if it is desired to maintain a sufficiently high production yield. This side flow of dielectric paste at the via holes, which reduces the cross-section of each via and increases the possibility of open circuit vias for making via interconnections has to be developed. One such other technique involves screen printing vias by means of conductor paste in successive layers, drying and firing of the vias followed by screen printing of the surrounding dielectric paste by means of a complementary screen. This technique, however, proved to be hardly practical due to the sharpness of the vias which tend to damage the complementary screen which is used for screen printing the dielectric paste.

The object of this invention is to provide a process for making interconnection vias in multilayer thick-film hybrid circuits which allows maximum packing density at production yield that exceeds the results obtainable with most conventional thick-film multilayer construction techniques.

Consequently the present invention provides a process for screen printing multilayer thick-film structure including screen printing vias by means of registration ink whose point of sublimation or evaporation is at least slightly below the firing temperature of the dielectric paste used for making the various layers of dielectric. After screen printing the registration ink, it is allowed to dry after which the dielectric paste is screen deposited, dried and then fired with the result that the temporary vias evaporate or sublime leaving cavities in the dielectric layer. Slight buffing might be required in order to uncover the via holes and finally the vias and the next connductor plane are deposited, dried and then fired.

The invention also provides thick-film multilayer structures produced in accordance with this process.

In the acccompanying drawings wherein a preferred embodiment of this invention is illustrated and compared to prior art techniques.

FIGS. 1 and 2 illustrate in cross-sections two different prior art vias,

FIG. 3 illustrates an ideal via by means of a cross-sectional view similar to those in FIG. 1 and 2, FIGS. 4, 5, and 6 illustrate in successive cross-sectional views a particular via being produced in accordance with this invention.

Throughout the six Figures, reference numeral 1 refers to a substrate of ceramic material or other suitable materials as generally used in the making of thick-film multilayer hybrid circuits, element 2 is a first conductor plane onto which is screen deposited a dielectric layer 3. A second conductor plane 5 is disposed over the dielectric layer 3 and interconnected to conductor plane 2 by means of via interconnection 4.

FIG. 1 is used to illustrate the conventional via construction wherein after firing of the first conductor plane 2 a layer of dielectric paste is deposited leaving via holes to be filled later on by means of conductor material. To obtain a well defined via diameter "d", a suitable dielectric paste must be used, which will not unduly flow inwardly as seen at 10 nor result in an excessive enlargement of the via hole towards its opening as illustrated at 12. After drying and firing of the dielectric paste, the via connection 4 is formed by depositing a suitable conductor paste by screen printing over the via holes followed by screen printing of the second conductor plane 5. It is also known to simultaneously deposit the vias and the second conductor plane although there may result a slight depression directly over the vias.

The main disadvantage associated with this prior art technique is caused by the inward flow of dielectric material at 10 with consequential increase in the probability of complete obstruction of the via and resulting failure of the hybrid structure. Likewise, widening of the via hole at its other end 12 reduces the packing density of the multilayer structure due to the necessity to leave more space around the individual vias; this creates distortions in the circuit layout. The use of a more viscous dielectric paste should produce better defined vias, but beyond a certain point pin holes appear in the layer of dielectric material, which can be filled with conductor material and produce short circuits that render the hybrid structure useless.

FIG. 2 illustrates a differrent via construction technique wherein after depositing the first conductor plane 2, successive layers of conductor paste are screen deposited to form via 4 which will be dried and then fired. After that a layer of dielectric paste is screen deposited, dried and fired forming the dielectric layer 3. Subsequently a second conductor plane 5 is screen deposited, dried and then fired.

However, the formation of via 4 by successive deposition of conductor paste results in a relatively sharp needle point that tends to damage the screen used for printing the dielectric layer 3 with the result that this method is more costly. Another disadvantage comes from the fact that the top portion of via 4 interconnecting with conductor plane 5 is of relatively small diameter compared to nominal dimension "d" which may result in increased resistance within the hybrid structure.

In FIG. 3 the ideal via construction is illustrated wherein the diameter of the via is uniformily equal to "d" with the surrounding wall of dielectric layer 3 being cylindrical and sharply defined.

The ideal construction illustrated in FIG. 3 should enable maximum packing density and maximum production yields.

FIGS. 4, 5 and 6 illustrate a substrate 1, a first conductor 2 over which a dielectric layer 3 with interconnection via 4 are formed in accordance with the present invention. With reference to FIG. 4, after firing the first conductor plane 2, a temporary via 15, made of registration ink, is screen deposited and then allowed to dry. The term "registration ink" as used herein and in the claims refers to any suitable substance for making temporary vias in accordance with this invention. Complimentary or complete screening of a dielectric paste is then effected taking care to select a dielectric paste that will not mix with registration ink 15 and that will adequately surround the temporary via 15. Once dried, the dielectric paste is fired; and due to the fact that the selected registration ink has a point of evaporation or sublimation which is slightly below the firing temperature, it will completely disappear during firing, leaving a via hole surrounded with dielectric material substantially as illustrated in FIG. 5. Slight buffing may then be effected (particularly when dielectric paste was applied over the entire surface) so, as to remove the extra dielectric material around the via hole as at 16, thus leaving a substantially planar surface as shown in FIG. 5 by means of dotted line 17.

The via hole is then filled with additional conductor material, e.g., conductor (that is, additional to the conductor layer 2) paste by means of screening with a screen identical to the registration ink screen, and after drying, additional conductor material is deposited, dried and fired to form a second conductor plane 5. In most cases a single application of said additional conductor material will suffice to fill via holes and deposit the second conductor plane.

The resulting structure is illustrated in FIG. 6 where it will be seen that the interconnection via 4 closely approximates the ideal solution illustrated in FIG. 3 except for a slight widening of via 4 towards its base.

It will be appreciated that care must be taken when selecting the registration ink and the dielectric paste to ensure compatibility and for example avoid mixing of the two materials during firing of the dielectric material. The registration ink may be relatively viscous in order to obtain a temporary via whose side wall will remain essentially vertical until dried. The material used in the registration ink should completely evaporate or sublimated during the firing operation in order to leave practically no trace over the underlying conductor plane, and in practice a suspension of fine particles of carbon in an evaporating binding solution has been found quite suitable for this purpose. One commercially available registration ink found adequate is marketed under the trade mark EMCA and bears catalogue number 2213, this particular ink evaporates at a temperature of about 700°C. The dielectric paste sold under the trade mark EMCA, catalogue number EXK 3186A has been found to be quite compatible with the above noted EMCA registration ink.

The embodiments of the invention in which an exclusive property or privilege is claimed are defined as follows:

1. A process for constructing multilayer thick-film hybrid circuits on a surface of a substrate comprising in sequence the following steps: depositing, drying and then firing a first conductor plane by screen printing a thick-film conductor paste on the substrate, depositing registration ink by screen printing for making temporary vias, drying said registration ink, depositing by screen printing a thick-film dielectric paste over the surface of said substrate but not over said temporary vias, drying said dielectric paste, firing said temporary vias, drying said dielectric paste, firing said dielectric paste, said registration ink consisting of a substance whose point of sublimation or evaporation is slightly below the firing temperature of said dielectric paste, and, after sublimation or evaporation of said registration ink, depositing by screen printing additional conductor material, drying and firing said additional conductor material for forming a second conductor plane and filling the via holes and making connection with said first conductor plane.

2. A process as defined in claim 1 for constructing additional conductor planes interleaved with additional layers of dielectric material having vias therein filled with conductor material, comprising for each additional conductor plane, the said sequence of steps for applying the registration ink, the dielectric paste and the additional conductor material, and further including buffing the surface of each layer of dielectric paste once fired around any via holes therethrough.

3. A process as defined in claim 2, wherein the step of forming the conductor material in any additional layers of dielectric material and the additional conductor plane immediately above that said layer of dielectric material comprises first depositing a vias pattern of said conductor paste on said layer of dielectric material, drying and then firing said last mentioned conductor paste and then depositing additional conductor material thereover to form said additional conductor plane.

4. A process as defined in claim 1 wherein the step of depositing the additional conductor material comprises first depositing a vias pattern of said conductor paste, drying and then firing said last mentioned conductor paste and then depositing additional conductor material thereover to form said second conductor plane.

5. A process for constructing multilayer thick-film hybrid circuits on a surface of a substrate comprising in sequence the following steps: depositing, drying and then firing a first conductor plane by screen printing a thick-film conductor paste on said surface, depositing registration ink by screen printing for making temporary vias on said conductor plane, drying said registration ink, depositing by screen printing a thick-film dielectric paste over the whole of said surface, drying and then firing said dielectric paste, said registration ink consisting of a substance whose point of sublimation or evaporation is slightly below the firing temperature of said dielectric paste, said process also comprising the following sequential steps of buffing the surface of said fired dielectric paste just sufficiently to remove any extra fired dielectric paste around the via holes, depositing, drying and then firing a second conductor plane over the buffed surface of the dielectric layer for filling said via holes and making connection with said first conductor plane.

6. A process as defined in claim 5 including as a series of additional steps immediately preceeding the step of depositing said second conductor plane: depositing a vias pattern of said conductor paste, drying and then firing said last mentioned conductor paste.

* * * * *